United States Patent
Isodono et al.

(10) Patent No.: US 6,886,076 B1
(45) Date of Patent: Apr. 26, 2005

(54) SEMICONDUCTOR INTEGRATED CIRCUIT DEVICE HAVING CONNECTION PADS FOR SUPERPOSING EXPANSION MEMORY

(75) Inventors: Koji Isodono, Kashiba (JP); Hitoshi Saito, Sakurai (JP); Toyohiko Tanaka, Yamatokoriyama (JP); Hitoshi Imai, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/497,121

(22) Filed: Feb. 3, 2000

(30) Foreign Application Priority Data

Apr. 28, 1999 (JP) .......................................... H11-121541
Jan. 13, 2000 (JP) .......................................... 2000-010025

(51) Int. Cl.[7] ............................................. G06F 12/00
(52) U.S. Cl. ............................ 711/115; 711/2; 710/13; 710/301
(58) Field of Search ........................... 365/189.02, 200, 365/201; 174/52.4, 250; 710/13, 14, 101, 300, 301, 302; 711/2, 5, 115

(56) References Cited

U.S. PATENT DOCUMENTS

| | | | | |
|---|---|---|---|---|
| 3,753,235 A | * | 8/1973 | Daughton et al. | 365/200 |
| 5,214,570 A | * | 5/1993 | Shah et al. | 361/684 |
| 5,514,907 A | * | 5/1996 | Moshayedi | 257/685 |
| 5,677,877 A | * | 10/1997 | Yoon et al. | 365/189.02 |
| 6,026,039 A | * | 2/2000 | Kim et al. | 365/201 |
| 6,043,430 A | * | 3/2000 | Chun | 174/52.4 |
| 6,233,157 B1 | * | 5/2001 | Yoon et al. | 174/250 |

FOREIGN PATENT DOCUMENTS

JP        A3268450        11/1991

* cited by examiner

*Primary Examiner*—B. James Peikari
(74) *Attorney, Agent, or Firm*—Birch, Stewart, Kolasch & Birch, LLP

(57) ABSTRACT

An IC has pads provided on the conductors that are connected to the input/output terminals of a memory block thereof so as to allow the input/output pads of an external memory chip to be connected to the pads of the IC. By superposing the memory chip on the IC with their pads mutually connected, expansion of memory is achieved without increasing the chip size. The IC has a control circuit for determining whether to use the memory block or the memory chip so as to allow switching between them as required.

21 Claims, 7 Drawing Sheets

FIG.1
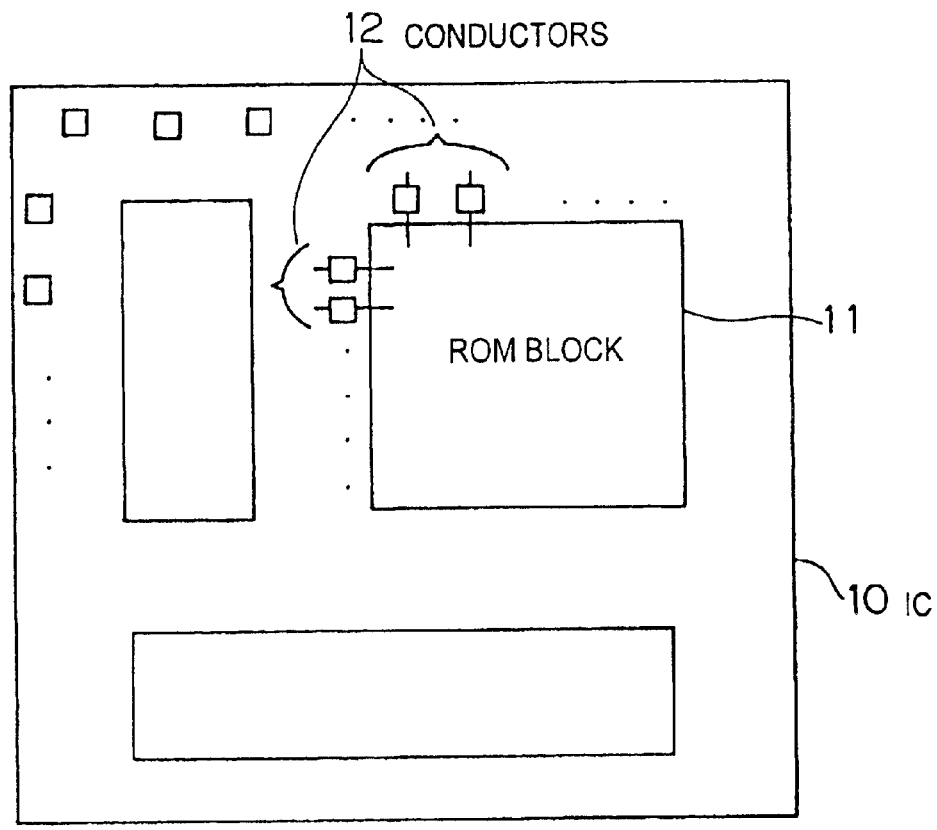
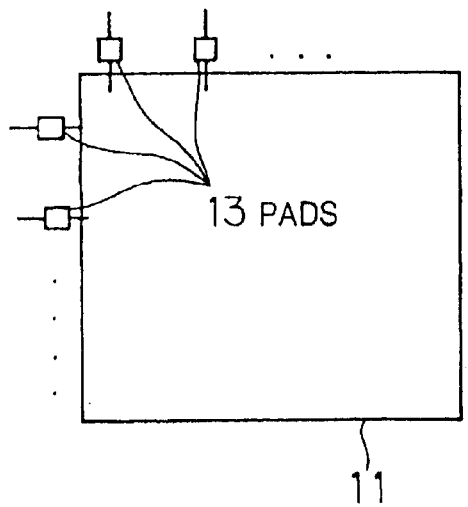
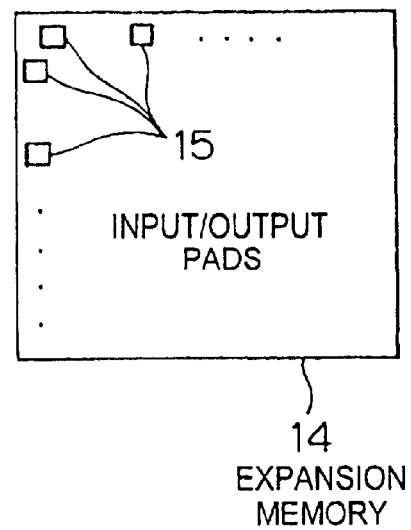

SEMICONDUCTOR INTEGRATED CIRCUIT DEVICE HAVING CONNECTION PADS FOR SUPERPOSING EXPANSION MEMORY

BACKGROUND OF THE INVENTION

1. Field of the Invention

The present invention relates to expansion of memory in a semiconductor integrated circuit device (hereinafter referred to as an "IC") incorporating memory.

2. Description of the Prior Art

As shown in FIG. 13, a conventional IC 30 incorporating memory is composed of a ROM block 31 and other blocks, and, within the IC 30, the input/output terminals of the ROM block 31 are connected to the other blocks by way of metal conductors 32. Usually, the input/output signals to and from the ROM block 31 do not directly appear outside the IC 30.

A typical example of such an IC incorporating memory is a microcomputer, which is usually used to control another system. For example, in a case where a one-chip microcomputer is used to control a household electric appliance, programs and data are stored in the ROM and RAM, respectively, incorporated therein. Here, the capacity of each type of memory is set to the minimum required by the system in order to minimize the chip cost. On the other hand, household electric appliances nowadays tend to undergo frequent renewal or redesigning, with their functions improved or expanded on every such occasion to meet consumers' needs. Such functional improvement or expansion of a household electric appliance is usually achieved by rewriting the programs stored in the ROM of the microcomputer built in its control system.

However, in general, improving the functions of a product involves increasing the complexity of its control, and expanding the functions of a product involves adding new programs. Thus, in either case, the programs require more memory, making the memory incorporated in the microcomputer insufficient. In such a case, it is inevitable either to increase the memory capacity of the microcomputer or to mount expansion memory on the system board. Quite inconveniently, however, the former requires the redesigning of a microcomputer having the needed memory capacity, and the latter requires the redesigning of a system board, leading, in either case, to a large increase in the development cost.

It is possible to initially mount extra memory in anticipation of future improvement or expansion, but this involves paying the cost of the extra memory that is unused at first. Even if the programs come to require more memory as the functions are improved or expanded, there still remains a possibility that part of the extra memory will remain unused, resulting in an excess cost, or a possibility that the programs will require more memory than has been anticipated, inevitably requiring redesign of the microcomputer or the system board.

Japanese Laid-Open Patent Application No. H3-268450 discloses a method of relieving defective blocks in an IC by superposing an auxiliary IC thereon. This method helps avoid making the chip size of the IC or the system board larger. However, this method involves cutting the conductors connecting the defective blocks of the IC to the inside of the IC and keeping the outputs from the defective blocks from appearing outside the IC, and thus, although quite naturally with defective blocks, some blocks are wastefully left unusable.

SUMMARY OF THE INVENTION

An object of the present invention is to provide an IC whose memory capacity can be increased without increasing the chip size thereof when more memory is needed due to an improvement or the like of the functions of a system.

To achieve the above object, according to the present invention, a semiconductor integrated circuit device, i.e. an IC, has a switching means for switching between a select signal and a non-select signal for a built-in memory block and a switching means for switching between a select signal and a non-select signal for an expansion memory, and is provided with select signal generating circuits that serve as the switching means by controlling such switching and connection pads that are provided inside the IC so as to allow the expansion memory to be connected to the built-in memory block.

This structure makes it possible to select and use only the memory built in the IC as long as it has the desired capacity. When the memory capacity needs to be increased, an expansion memory is added in such a way that either the built-in or expansion memory is selectively used. This makes expansion of memory easy. Since the IC is provided with connection pads, the expansion memory can easily be added thereto.

In the above-described IC, the expansion memory may be superposed on the IC, with the connection pads electrically connected to the external connection pads of the expansion memory. Superposing the expansion memory on the IC helps avoid making the chip size larger.

The above-described IC may be further provided with a disconnecting means for electrically disconnecting the connection pads provided inside the IC from the built-in memory block in accordance with the type of the signal of the switching means for switching between the select signal and the non-select signal. The connection pads are prone to cause parasitic capacitance. Electrically disconnecting the connection pads from the built-in memory block helps prevent the influence of such parasitic capacitance when the memory block is being selected.

The above-described IC may be so designed that addition or modification of a program, if required in a system incorporating the IC, can be achieved by superposing thereon the expansion memory having a program to be added or a modified program stored therein. This helps reduce the modification of the programs stored in the IC to, for example, modifying jump addresses and the like, and thus makes efficient addition or modification of a program possible.

Alternatively, the above-described IC may be so designed that addition or modification of a program, if required in a system incorporating the IC, can be achieved by simply adding or modifying a program in the expansion memory. This eliminates the need to modify the programs stored in the IC, and thus makes highly efficient addition or modification of a program possible.

The above-described IC may be further provided with a disconnecting means for electrically disconnecting the connection pads from the built-in memory block when the expansion memory is not superposed on the IC or when the expansion memory is not being selected. The connection pads are prone to cause parasitic capacitance, and therefore disconnecting them from the memory block when the expansion memory is not used helps prevent the influence of parasitic capacitance when the built-in memory block is used.

In the above-described IC, the expansion memory may have its power pad and ground pad individually connected directly to the power pin and ground pin of a lead frame by way of wires. This structure permits electric power to be supplied directly from the lead frame to the expansion memory, and thus makes it easy to secure the current capacity required by the expansion memory.

Here, the expansion memory may be provided with pads that are dedicated to the wires laid to achieve direct connection to the power pin and ground pin of the lead frame. Bonding more than one wire to a single pad makes the bonding operation difficult and tends to damage the pad. By contrast, if dedicated pads re provided, wires can be bonded thereto easily without damaging the pads.

BRIEF DESCRIPTION OF THE DRAWINGS

This and other objects and features of the present invention will become clear from the following description, taken in conjunction with the preferred embodiments with reference to the accompanying drawings in which:

FIG. 1 is a diagram schematically showing the structure of the mother chip of the IC of a first embodiment of the invention;

FIGS. 2A and 2B are diagrams showing an example of the positional relationship between the pads of the mother chip and the pads of the daughter chip in the IC of the first embodiment;

DESCRIPTION OF THE PREFERRED EMBODIMENTS

Hereinafter, ICs embodying the present invention will be described with reference to the accompanying drawings. It is to be understood that, although the embodiments described below deal only with arrangements that employ ROM as memory, the present invention is applicable also to arrangements that employ any other type of memory.

FIG. 1 shows the IC of a first embodiment of the invention. This IC is designed to allow an expansion memory to be superposed thereon at a later time. For easy distinction, in the following descriptions, the IC will be referred to as the mother chip and the expansion memory as the daughter chip.

Figure 13:
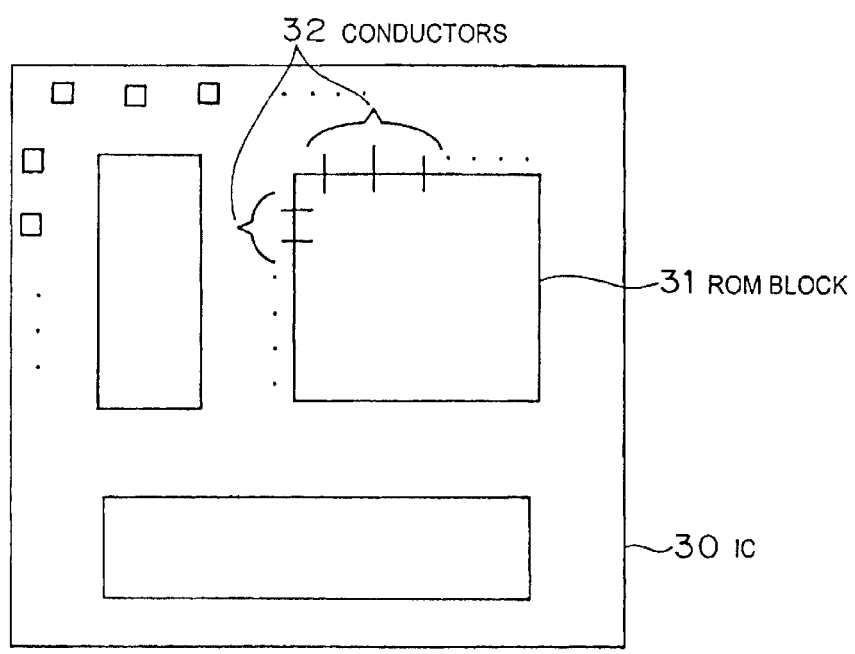
FIG. 13 is a diagram schematically showing the structure of a conventional IC.

The mother chip 10 is, like the conventional IC 30 shown in FIG. 13, composed of a ROM block 11 and other blocks. However, in this embodiment, the input/output terminals of the ROM block 11 are connected to the other blocks within the mother chip 10 by way of metal conductors 12 each having a pad hereon. The conductors 12 include those for transferring input signals such as addresses and clocks from the other blocks to the ROM block 11, those for transferring output signals such as program codes and data from the ROM block 11 to the other blocks, and others.

What types of blocks the mother chip 10 is composed of greatly varies depending on its use, but it is invariably provided with conductors 12 each having a pad thereon irrespective of what types of blocks it is composed of. In a system employing such a mother chip 10, even if it becomes necessary to increase the memory capacity as a result of functional improvement, it is possible to cope with the situation by superposing a daughter chip having the required additional memory capacity on the mother chip 10. The pads of the conductors 12 are used to electrically connect the daughter chip to the mother chip 10.

FIGS. 2A and 2B show an example of the positions of the pads 13 provided on the conductors 12 that are connected to the ROM block 11 within the mother chip 10 and the positions of the input/output pads 15 provided on the daughter chip 14. The pads 15 of the daughter chip 14 are connected to the input/output terminals of the memory formed inside the chip. The daughter chip 14 has roughly the same size (area) as the ROM block 11. As shown in FIG. 2A, the pads 13 are provided near the portion of the surface of the mother chip 10 where the ROM block 11 is formed. On the other hand, as shown in FIG. 2B, the pads 15 are provided near the edge of the surface of the daughter chip 14.

Figure 3:
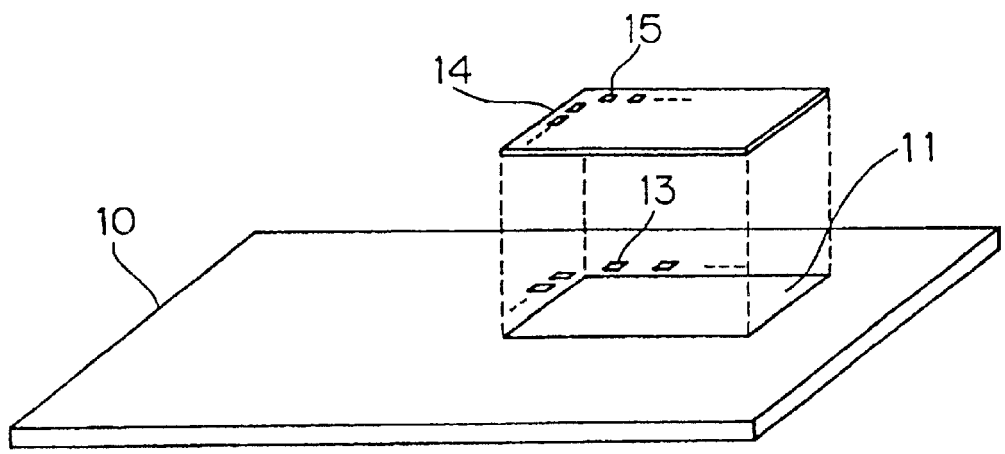
FIG. 3 is a perspective view showing how the daughter chip is superposed on the mother chip in the example shown in FIGS. 2A and 2B.
Figure 4:
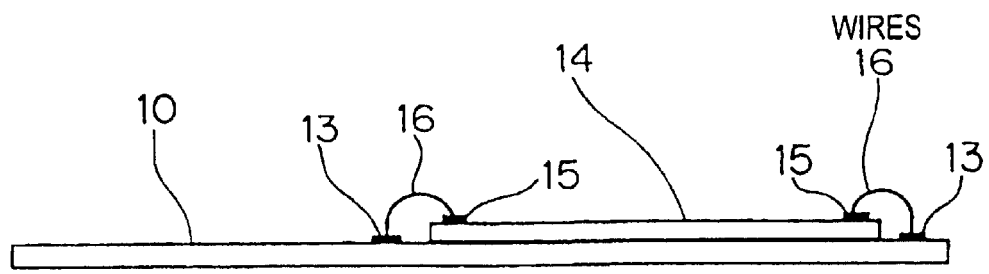
FIG. 4 is a side view showing the daughter chip superposed on the mother chip in the example shown in FIGS. 2A and 2B.

FIG. 3 shows how the daughter chip 14 is superposed on the mother chip 10 in this example. FIG. 4 shows a side view of the daughter chip 14 thus superposed on the mother chip 10. The daughter chip 14 is superposed on and fixed, with an adhesive or the like, to the surface of the portion of the mother chip 10 where the ROM block 11 is provided, with the surface of the daughter chip 14 on which the pads 15 are provided facing opposite the mother chip 10. Then, the pads 13 are connected to the corresponding ones of the pads 15 individually by way of wires 16. Here, to prevent the wires 16 from crossing one another and to minimize their lengths, it is preferable to arrange the pads 15 on the daughter chip 14 in the same order and at roughly the same intervals as the pads 13 arranged on the mother chip 10.

Figure 5A:
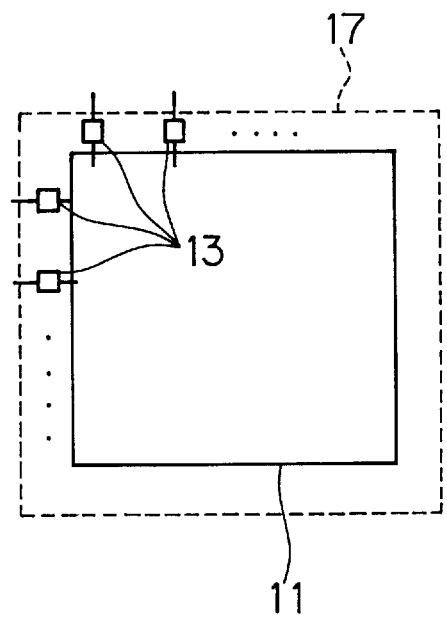
FIGS. 5A and 5B are diagrams showing another example of the positional relationship between the pads of the mother chip and the pads of the daughter chip in the IC of the first embodiment.
Figure 5B:
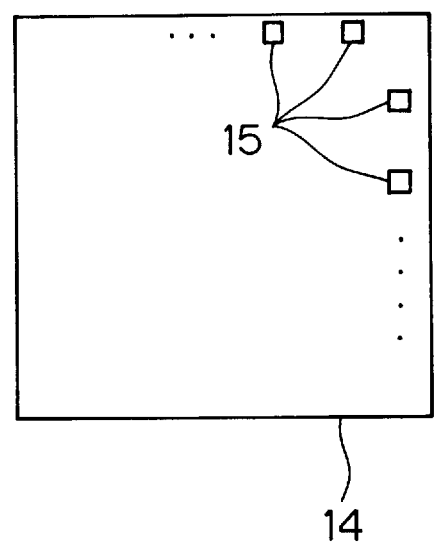

FIGS. 5A and 5B show another example of the positions of the pads 13 of the mother chip 10 and the positions of the pads 15 of the daughter chip 14. In this example, the daughter chip 14 is made somewhat larger than the ROM block 11. As shown in FIG. 5A, the pads 13 are provided near the portion of the surface of the mother chip 10 where the ROM block 11 is formed. On the other hand, as shown in FIG. 5B, the pads 15 are provided near the edge of the surface of the daughter chip 14.

Figure 6:
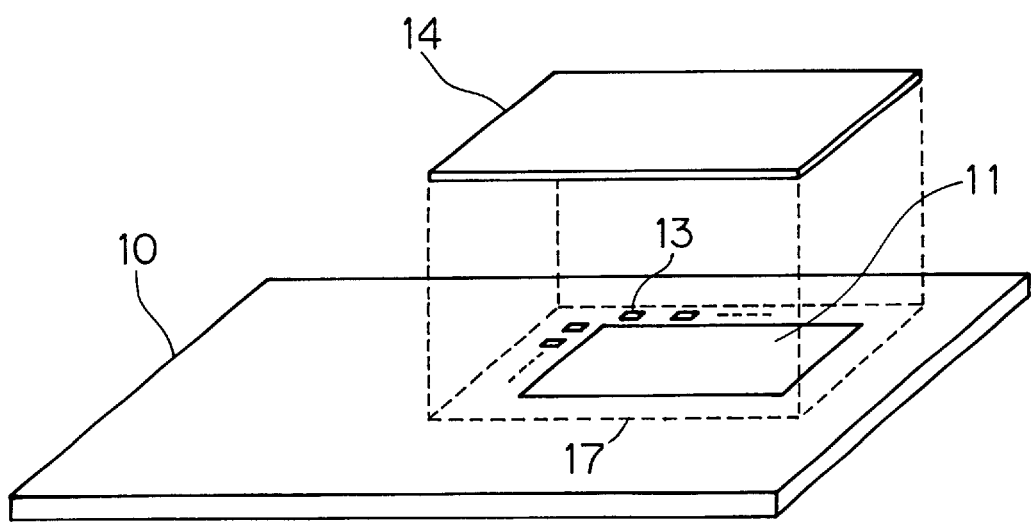
FIG. 6 is a perspective view showing how the daughter chip is superposed on the mother chip in the example shown in FIGS. 5A and 5B.
Figure 7:
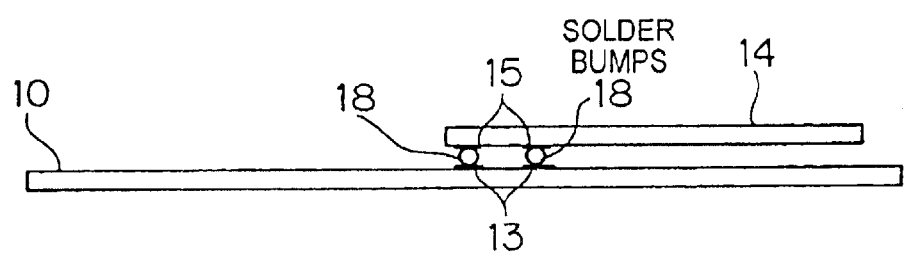
FIG. 7 is a side view showing the daughter chip superposed on the mother chip in the example shown in FIGS. 5A and 5B.

FIG. 6 shows how the daughter chip 14 is superposed on the mother chip 10 in this example. FIG. 7 shows a side view of the daughter chip 14 thus superposed on the mother chip 10. The daughter chip 14 is superposed above a region 17 that completely encloses the portion of the surface of the mother chip 10 where the ROM block 11 is provided, with the surface of the daughter chip 14 on which the pads 15 are provided facing the mother chip 10. As shown in FIG. 7, the pads 13 of the mother chip 10 are connected to the pads 15 of the daughter chip 14 by way of solder bumps 18 that are previously provided on the pads 13. Here, the pads 15 of the daughter chip 14 need to be so arranged as to be mirror-symmetrical with the pads 13 of the mother chip 10.

This superposition method requires no pads or wires on the surface of the daughter chip 14 after superposition, and thus allows another chip larger than the daughter chip 14 to be superposed further thereon. It is to be noted that the daughter chip 14 here does not necessarily have to be made larger than the ROM block 11 so as to cover the ROM block 11 completely. Alternatively, it is also possible, for example, to make the daughter chip 14 roughly as large as the ROM block 11 and superpose the daughter chip 14 in a somewhat shifted position so that the pads 15 will face the pads 13.

Figure 8:
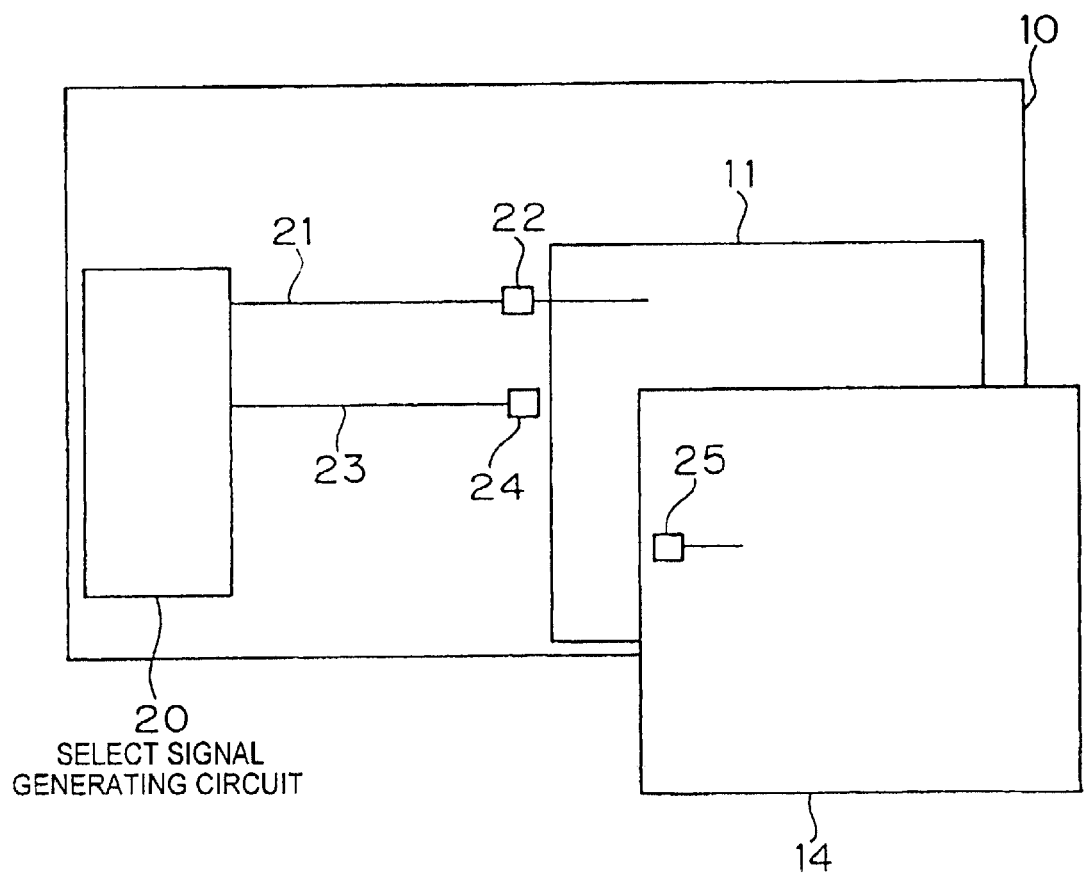
FIG. 8 is a diagram schematically showing the structure related to the control of the ROM block provided on the mother chip and the memory provided on the daughter chip.

FIG. 8 shows the structure related to the control of the ROM block 11 provided on the mother chip 10 and the memory provided on the daughter chip 14. The mother chip 10 is provided with a select signal generating circuit 20, a ROM block select signal line 21, a ROM block select signal input pad 22, a daughter chip select signal line 23, and a daughter chip select signal output pad 24. On the other hand, the daughter chip 14 is provided with a daughter chip select signal input pad 25. When the daughter chip 14 is superposed on the mother chip 10, the daughter chip select signal output pad 24 of the mother chip 10 is electrically connected to the daughter chip select signal input pad 25 of the daughter chip 14. This connection is achieved in the same manner as the connection between the pads 13 and 15.

The select signal generating circuit 20 generates a ROM block select signal or selecting the ROM block 11 and a daughter chip select signal for selecting the daughter chip 14 on the basis of the memory addresses allocated individually to those two portions of ROM. When the ROM block 11 is selected, the ROM block select signal generated by the select signal generating circuit 20 is fed, by way of the ROM block select signal line 21 and via the ROM block select signal input pad 22, to the inside of the ROM block 11. This brings the ROM block 11 into a state in which it can be accessed for input/output operations, i.e. an enabled state.

When the daughter chip is selected, the daughter chip select signal generated by the select signal generating circuit 20 is fed, by way of the daughter chip select signal line 23, via the daughter chip select signal output pad 24, and via the daughter chip select signal input pad 25, to the inside of the daughter chip. This brings the daughter chip 14 into an enabled state.

The ROM block 11 and the daughter chip 14 may be selected either exclusively or simultaneously. Exclusive selection is achieved by bringing the daughter chip select signal into a non-select state when the ROM block select signal is brought into a select state and bringing the ROM block select signal into a non-select state when the daughter chip select signal is brought into a select state. Whichever of the ROM block 11 and the daughter chip 14 receives its select signal in a non-select state is brought into a disabled state in which it cannot be accessed for input/output operations. Exclusive selection is suitable to read continuously from either of the ROM block 11 and the daughter chip 14. On the other hand, simultaneous selection is suitable to read alternately from the ROM block 11 and the daughter chip 14.

Figure 9:
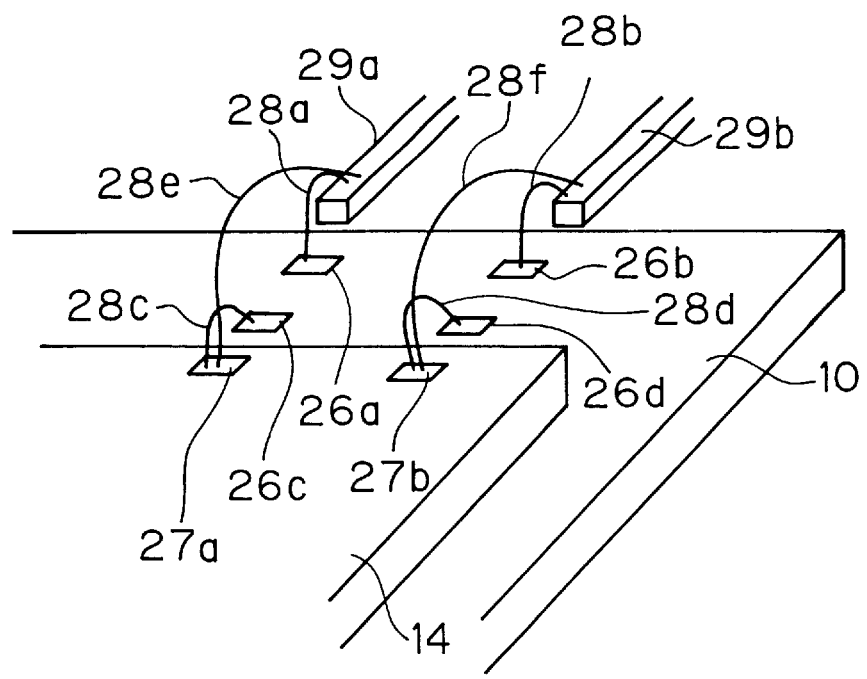
FIG. 9 is a diagram showing an example of how connection to the supplied power and the ground level is achieved when the IC of the first embodiment is formed into an end product.

FIG. 9 shows an example of how connection to the supplied power and the ground level is achieved when the IC having the daughter chip 14 superposed on the mother chip 10 is packaged so as to be formed into an end product. The mother chip 10 is die-bonded to an island (not shown) of a lead frame having various input/output pins including a power pin 29a and a ground pin 29b, and is then sealed in resin. The power pin 29a is connected to a power source that supplies electric power to the IC as an end product, and the ground pin 29b is connected to a ground level.

The mother chip 10 is provided with a power pad 26a and a ground pad 26b. The power pad 26a and the ground pad 26b are connected, by way of wires 28a and 28b, to the power pin 29a and the ground pin 29b, respectively. All of the circuits formed on the mother chip 10 including the ROM block 11 operate from the electric power supplied via the power pad 26a. The mother chip 10 is also provided with pads 26c and 26d that are, within the mother chip 10, connected to the power pad 26a and the ground pad 26b.

The daughter chip 14 is provided with a power pad 27a and a ground pad 27b. The power pad 27a and the ground pad 27b are connected, by way of wires 28c and 28d, to the pads 26c and 26d, respectively, of the mother chip 10. The power pad 27a and the ground pad 27b are connected also, by way of wires 28e and 28f, to the power pin 29a and the ground pin 29b, respectively. Thus, the daughter chip 14 is connected to the power pin 29a and the ground pin 29b both indirectly, i.e. through the mother chip 10, and directly, independently of the mother chip 10. The daughter chip 14 operates from the electric power supplied via the power pad 27a.

Connecting the daughter chip 14 to the power pin 29a and the ground pin 29b through the mother chip 10 makes it easy to test the operation of the IC as a whole before packaging. On the other hand, connecting the daughter chip 14 directly to the power pin 29a and the ground pin 29b helps secure the current capacity required when the IC is used as an end product. It is also possible to connect the daughter chip 14 to the power pin 29a and the ground pin 29b only through the mother chip 10; in that case, to secure the required current capacity, within the mother chip 10, the conductor connecting the power pad 26a to the pad 26c and the conductor connecting the ground pad 26b to the pad 26d need to be made accordingly thick and wide.

Figure 10:
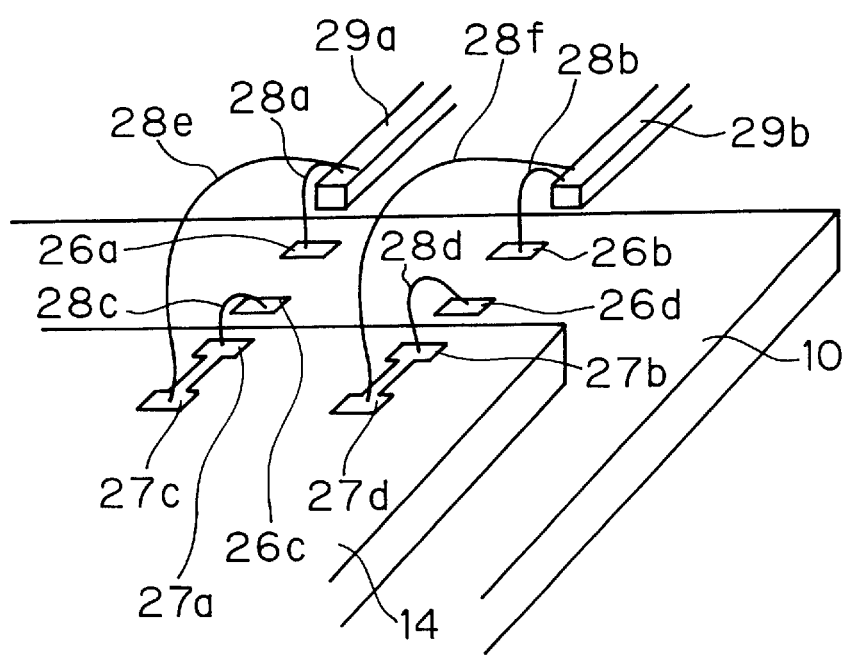
FIG. 10 is a diagram showing another example of how connection to the supplied power and the ground level is achieved when the IC of the first embodiment is formed into an end product.

FIG. 10 shows another example of how the mother chip 10 and the daughter chip 14 are connected to the power pin 29a and the ground pin 29b. In this example, in addition to the power pad 27a and the ground pad 27b mentioned above, another pair of a power pad 27c and a ground pad 27d is provided on the daughter chip 14, and the wires 28e and 28f here are connected to the power pad 27c and the ground pad 27d. The power pads 27a and 27c are connected to each other, and the ground pads 27b and 27d are connected to each other.

Providing separate pads for individual wires in this way helps reduce the damage caused to the pads when the wires are fitted thereto, and thereby achieve more secure electrical connection. This also helps reduce the possibility of the fitting tool touching already laid wires, and thus makes the fitting of the wires to the pads easier.

Although the above examples deal only with packaging using a lead frame, the connection methods described above are applicable also to packaging in which an IC is mounted on an insulating substrate having conductors connected to a supplied power and a ground level.

Figure 11:
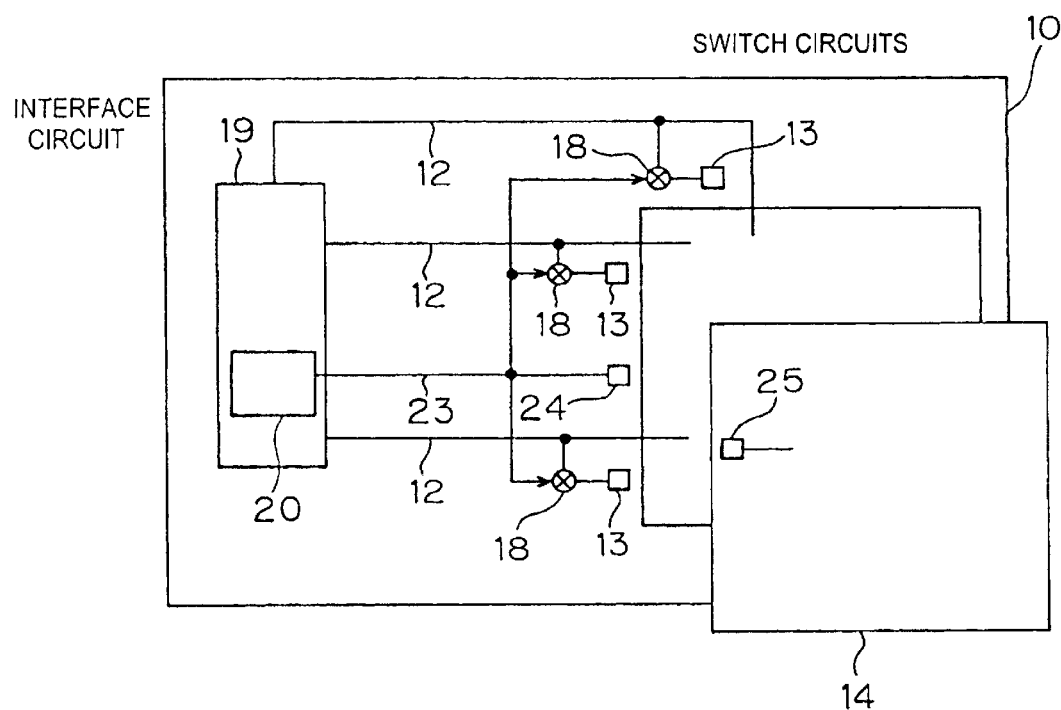
FIG. 11 is a diagram schematically showing the structure of the IC of a second embodiment of the invention.

FIG. 11 shows the IC of a second embodiment of the invention. This IC has a structure similar to that of the IC of the first embodiment. Accordingly, such elements as are found in both embodiments are identified with the same reference numerals, and overlapping descriptions will not be repeated. In contrast to the first embodiment, where the pads 13 are formed on the metal conductors 12, in this embodiment, the pads 13 are so formed as to be separate from the metal conductors 12, and the metal conductors 12 are connected to the pads 13 individually through switch circuits 18. The switch circuits 18 are either in a conducting state or in a non-conducting state at a time, and their states are switched by the daughter chip select signal mentioned previously. When the switch circuits 18 are in a conducting state, the metal conductors 12 are electrically connected to the pads 13; when the switch circuits 18 are in a non-conducting state, the metal conductors 12 are electrically disconnected from the pads 13.

Figure 12:
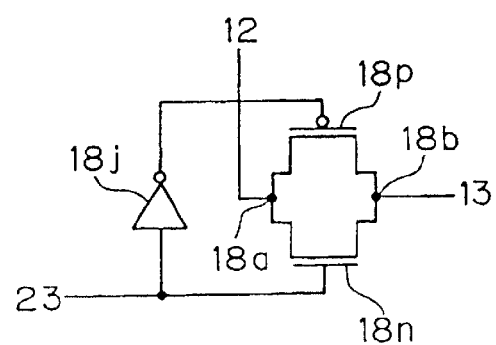
FIG. 12 is a diagram showing an example of the configuration of the switch circuits provided in the mother chip in the second embodiment.

FIG. 12 shows an example of the configuration of the switch circuits 18. The switch circuits 18 are each composed of a p-channel transistor 18p, an n-channel transistor 18n, and an inverter 18j. In each of the switch circuits 18, the transistors 18p and 18n have their sources connected together and have their drains connected together, with one node 18a connected to one of the metal conductors 12 and the other node 18b connected to one of the pads 13. The n-channel transistor 18n has its gate connected directly to the daughter chip select signal line 23, and the p-channel transistor 18p has its gate connected through the inverter 18j to the daughter chip select signal line 23.

When the daughter chip select signal is at a high level, which indicates that it is in a selected state, a high level is fed to the n-channel transistor 18n and a low level is fed to the p-channel transistor 18p. This brings both of these transistors 18n and 18p into a conducting state and thereby causes the metal conductor 12 to be connected to the pad 13. By contrast, when the daughter chip select signal is at a low level, which indicates that it is in a non-selected state, a low level is fed to the n-channel transistor 18n and a high level is fed to the p-channel transistor 18p. This brings both of these transistors 18n and 18p into a non-conducting state and thereby causes the metal conductor 12 to be disconnected from the pad 13.

The select signal generating circuit 20, which generates the daughter chip select signal and the ROM block select signal, is built as a part of an interface circuit 19 that performs read operations with respect to the ROM block 11 and the daughter chip 14. When the daughter chip 14 is superposed on the mother chip 10, the select signal generating circuit 20 brings the daughter chip select signal into a selected or non-selected state in accordance with whether the interface circuit 19 performs read operations with respect to the daughter chip 14 or not. On the other hand, when the daughter chip 14 is not superposed on the mother chip 10, the select signal generating circuit 20 keeps the daughter chip select signal in a non-selected state all the time.

Thus, the pads 13 are connected to the metal conductors 12 only when the daughter chip 14 is superposed on the mother chip 10 and in addition the daughter chip 14 is selected. Since the pads 13 have appreciable areas, they are prone to cause parasitic capacitance. However, by electrically disconnecting the pads 13 from the metal conductors 12, it is possible to prevent the influence of such parasitic capacitance on the input/output signals to and from the ROM block. That is, it is possible to prevent delay or waveform rounding in the input/output signals to and from the ROM block. This permits the IC to offer sufficiently high reliability.

It is possible to suppress parasitic capacitance by providing the pads 13 away from the conductors and circuits provided within the mother chip 10. However, this inevitably makes the mother chip 10 larger and imposes restrictions on the chip design. Providing switch circuits as in the IC of this embodiment makes it possible to arrange pads in desired positions without giving much consideration to their positions relative to other conductors and circuits. It is to be noted that input/output operations with respect to the daughter chip 14 are performed through buffers provided within the daughter chip 14, and therefore there is no risk of those input/output signals being influenced by parasitic capacitance.

Obviously, many modifications and variations of the present invention are possible in light of the above teachings. It is therefore to be understood that within the scope of the appended claims, the invention may be practiced other than as specifically described.

What is claimed is:

1. A semiconductor integrated circuit device having a switching means for switching between a select signal and a non-select signal for a built-in memory block and a switching means for switching between a select signal and a non-select signal for an expansion memory, comprising:
   select signal generating circuits that serve as the switching means by controlling such switching; and
   connection pads that are provided inside the semiconductor integrated circuit device so as to allow the expansion memory to be connected to the built-in memory block.

2. A semiconductor integrated circuit device as claimed in claim 1,
   wherein the expansion memory is superposed on the semiconductor integrated circuit device, and the connection pads are electrically connected to external connection pads of the expansion memory.

3. A semiconductor integrated circuit device as claimed in claim 2,
   wherein addition or modification of a program, if required in a system built by use of the semiconductor integrated circuit device, can be achieved by simply adding or modifying a program in the expansion memory.

4. A semiconductor integrated circuit device as claimed in claim 2,
   wherein the expansion memory has a power pad and a ground pad thereof individually connected directly to a power pin and a ground pin of a lead frame by way of wires.

5. A semiconductor integrated circuit device as claimed in claim 4,
   wherein the expansion memory has pads that are dedicated to the wires laid to achieve direct connection to the power pin and ground pin of the lead frame.

6. A semiconductor integrated circuit device as claimed in claim 1, further comprising:
   a disconnecting means for electrically disconnecting the connection pads from the built-in memory block in accordance with a type of a signal of the switching means for switching between the select signal and the non-select signal.

7. A semiconductor integrated circuit device as claimed in claim 1, wherein addition or modification of a program, if required in a system built by use of the semiconductor integrated circuit device, can be achieved by superposing thereon the expansion memory having a program to be added or a modified program stored therein.

8. A semiconductor integrated circuit device as claimed in claim 1, further comprising:

a disconnecting means for electrically disconnecting the connection pads from the built-in memory block when the expansion memory is not superposed on the semiconductor integrated circuit device or when the expansion memory is not being selected.

9. A semiconductor integrated circuit device including an integrated circuit chip comprising:

a memory block;

conductors individually connected to input/output terminals of the memory block;

pads provided on a surface of the integrated circuit chip and individually connected to the conductors so as to allow connection to an expansion memory; and a control circuit for switching a state of the memory block between an enabled state and a disabled state and, when the expansion memory is connected to the pads, for switching a state of the expansion memory between an enabled state and a disabled state.

10. A semiconductor integrated circuit device as claimed in claim 9, wherein the pads are each connected to the corresponding conductor through a switch circuit that is either in a conducting state or in a non-conducting state at a time, and, when the expansion memory is not connected to the pads, the control circuit brings the switch circuits into a non-conducting state so as to disconnect the pads from the conductors.

11. A semiconductor integrated circuit device as claimed in claim 9, further including, as the expansion memory, a memory chip that has on a surface thereof pads connected individually to input/output terminals thereof and that is fitted on the surface of the integrated circuit chip, with the pads of the memory chip individually connected to the pads of the integrated circuit chip.

12. A semiconductor integrated circuit device as claimed in claim 11, wherein the memory chip has an area roughly equal to an area of the memory block, and is fitted on the surface of the integrated circuit chip in such a way as to be substantially superposed on the memory block.

13. A semiconductor integrated circuit device as claimed in claim 11, wherein the memory chip has its pads provided on a surface thereof opposite to a surface thereof facing the integrated circuit chip, and the pads of the integrated circuit chip are connected to the pads of the memory chip by way of wires.

14. A semiconductor integrated circuit device as claimed in claim 11, wherein the memory chip has its pads provided on a surface thereof facing the integrated circuit chip, and the pads of the integrated circuit chip are connected to the pads of the memory chip by way of solder bumps.

15. A semiconductor integrated circuit device as claimed in claim 11, wherein the pads of the integrated circuit chip are each connected to the corresponding conductor through a switch circuit that is either in a conducting state or in a non-conducting state at a time, and the control circuit, when bringing the memory chip into a disabled state, brings the switch circuits into a non-conducting state so as to disconnect the pads of the integrated circuit chip from the conductors.

16. A semiconductor integrated circuit device as claimed in claim 11, wherein the control circuit, when bringing the memory block into an enabled state, brings the memory chip into a disabled state, and, when bringing the memory chip into an enabled state, brings the memory block into a disabled state.

17. A semiconductor integrated circuit device as claimed in claim 11, wherein the memory block is used to store a program, and the memory chip is used to store a modified or functionally expanded version of the program stored in the memory block.

18. A semiconductor integrated circuit device as claimed in claim 11, wherein the memory block and the memory chip are used to store mutually independent programs.

19. A semiconductor integrated circuit device as claimed in claim 11, wherein the memory block and the memory chip are used to store different portions of a same program.

20. A semiconductor integrated circuit device as claimed in claim 11, further including an integrated circuit chip fixing member having a power terminal to be connected to a supplied power and a ground terminal to be connected to a ground level, wherein the integrated circuit chip and the memory chip are both connected directly to the power terminal and the ground terminal by way of wires.

21. A semiconductor integrated circuit device as claimed in claim 20, wherein the memory chip is connected to the power terminal and the ground terminal also through the integrated circuit chip, and has a pad to which a wire is connected that is connected directly to the power terminal, a pad to which a wire is connected that is connected through the integrated circuit chip to the power terminal, a pad to which a wire is connected that is connected directly to the ground terminal, and a pad to which a wire is connected that is connected through the integrated circuit chip to the ground terminal.

* * * * *